US011222147B2

(12) United States Patent
Pinho

(10) Patent No.: US 11,222,147 B2
(45) Date of Patent: Jan. 11, 2022

(54) SYSTEM AND METHOD FOR AUTOMATED LAYOUT OF BUILDINGS

(71) Applicant: IMAGE CLONE, LLC, Burlington, NJ (US)

(72) Inventor: Fernando J. Pinho, Burlington, NJ (US)

(73) Assignee: Image Clone, LLC, Burlington, NJ (US)

( * ) Notice: Subject to any disclaimer, the term of this patent is extended or adjusted under 35 U.S.C. 154(b) by 328 days.

(21) Appl. No.: 16/279,497

(22) Filed: Feb. 19, 2019

(65) Prior Publication Data

US 2019/0258750 A1    Aug. 22, 2019

Related U.S. Application Data

(60) Provisional application No. 62/633,130, filed on Feb. 21, 2018.

(51) Int. Cl.
| | |
|---|---|
| *G06F 30/00* | (2020.01) |
| *G06F 40/00* | (2020.01) |
| *G01D 5/24* | (2006.01) |
| *G01D 5/26* | (2006.01) |
| *E01C 23/16* | (2006.01) |
| *G06F 30/13* | (2020.01) |
| *G06F 40/166* | (2020.01) |
| *G01D 5/244* | (2006.01) |

(52) U.S. Cl.
CPC ............ *G06F 30/13* (2020.01); *E01C 23/163* (2013.01); *G01D 5/2448* (2013.01); *G01D 5/26* (2013.01); *G06F 40/166* (2020.01)

(58) Field of Classification Search
CPC ...... G06F 30/13; G06F 40/166; E01C 23/163; G01D 5/2448; G01D 5/26
See application file for complete search history.

(56) References Cited

U.S. PATENT DOCUMENTS

| | | | |
|---|---|---|---|
| 2,610,413 A | 9/1952 | Dasey | |
| 5,755,072 A | 5/1998 | Lingafelter | |
| 6,064,940 A | 5/2000 | Rodgers et al. | |
| 8,355,818 B2 * | 1/2013 | Nielsen | G05D 1/0214 |
| | | | 700/258 |

(Continued)

FOREIGN PATENT DOCUMENTS

| | | |
|---|---|---|
| WO | 2004/107073 A1 | 12/2004 |
| WO | 2018/102846 A1 | 6/2018 |

OTHER PUBLICATIONS

"Overview—3D Laser Scanning", https://www.3dgroundworks.com/services/capture/3d-laser-scanning/∩!.

(Continued)

*Primary Examiner* — Alexander Satanovsky
*Assistant Examiner* — Lynda Dinh
(74) *Attorney, Agent, or Firm* — Archer & Greiner; Gregory J. Winsky, Esquire

(57) ABSTRACT

Starting from a set of plans, such as, without limitation, blueprints, drawings, or Autocad® files, a system and method for calibrating such plans and transferring such plans into a computer readable file and loading a specially designed electronic version of such plans into a hardware based system that locates, adjusts, transfers, and prints, to a desired scale, a lasting image of said construction plans drawn onto a building surface.

3 Claims, 11 Drawing Sheets

(56) References Cited

U.S. PATENT DOCUMENTS

| | | | |
|---|---|---|---|
| 8,485,743 B1* | 7/2013 | Bledsoe | B41J 3/36 400/62 |
| 2004/0143475 A1* | 7/2004 | Kilburn | G06Q 30/0613 705/315 |
| 2007/0260348 A1* | 11/2007 | Gordils | A45C 11/00 700/117 |
| 2008/0154538 A1 | 6/2008 | Stathis | |
| 2009/0277031 A1 | 11/2009 | Stocking | |
| 2013/0310971 A1 | 11/2013 | Prouty | |
| 2017/0278030 A1 | 9/2017 | Pettersson et al. | |
| 2017/0334189 A1 | 11/2017 | Nam | |
| 2018/0345533 A1* | 12/2018 | Hernandez | B33Y 30/00 |

OTHER PUBLICATIONS

"Precise Jobsite Data Capture", https://gc.trimble.com/product/dpi-8-handheld-3d-scanner, 2016.

"Trimble Field Points", https://gc.trimble.com/product/trimble-field-points, 2016.

"Trimble TX Series", https://gc.trimble.com/product/trimble-tx8-scanner, 2016.

"International Search Report", dated May 8, 2019.

"Precise Jobsite Data Capture", https://gc.trimble.com/product/dpi-8-handheld-3d-scanner, 2016 Trimble Navigation Limited; https://www.trimble.com/legal.aspx)/https://www.trimble.com/privacy/aspx); entire document relevant.

"Trimble Field Points", https://gc.trimble.com/product/trimble-field-points, 2016; Trimble Navigation Limited Legal Information; (https://www.trimble.com/legal.aspx) I Privacy Policy (https:/www.trimble.com/privacy.aspx); entire document relevant.

"Trimble TX Series", https://gc.trimble.com/product/trimble-tx8-scanner, 2016 Trimble Navigation Limited, Legal Information, (https://www./trimble.com/legal.com/legal.aspx) Privacy Policy (http://www. trimble.com/privacy.aspx); entire document relevant.

"Precise Jobsite Data Capture", https://gc.trimble.com/product/dpi-8-handheld-3d-scanner, 2016 Trimble Navigation Limited; http://www.trimble.com/legal.aspx)/http://www.trimble.com/privacy/aspx), entire document relevant.

"Trimble Field Points", https://gc.trimble.com/product/trimble-field-points, 2016; Trimble Navigation Limited Legal Information; (http://www.trimble.com/legal.aspx) I Privacy Policy (http://www.trimble.com/privacy.aspx); entire document relevant.

"Trimble TX Series", https://gc.trimble.com/product/trimble-tx8-scanner, 2016 Trimble Navigation Limited, Legal Information, (http://www/trimble.com/legal.com/legal.aspx) Privacy Policy (http://www.trimble.com/privacy.aspx); entire document relevant.

Extended European Search Report, dated Nov. 11, 2021, Reference PX694EP, Image Clone, LLC.

\* cited by examiner

SYSTEM AND METHOD FOR AUTOMATED LAYOUT OF BUILDINGS

CROSS REFERENCE TO RELATED APPLICATION

This application claims priority from U.S. Provisional Application No. 62/633,130 filed on Feb. 21, 2018.

FIELD OF THE INVENTION

The instant invention relates to the construction industry, specifically to the task of laying out a the points of reference as identified in blueprints for the construction of a structure, such as a building.

BACKGROUND OF THE INVENTION

The current method for laying out or marking for construction of buildings involves a significant number of resources in terms of time and man power, and thus ultimately, expense. Traditionally, the method for laying out a structure involves one, two, or even more individuals using a set of blue prints, plans, and drawings to walk the construction site or structure marking points and snapping lines to ensure that the building is square (See line 100A in Prior Art Figure 1) in order to allow for properly constructed walls and foundations (See Prior Art Figure 2) as well as other structures. In laying out a building, the workers are essentially transferring the information from the blue prints or drawings to the actual site at which the construction work is to be performed. An actual scale copy has to be transferred to or interpretation of the drawings has to be recreated to actual scale. The floor, walls, ceilings, and other structures have to be marked to show where structural components are to be built. On occasions, there are differences between the information provided on blueprints or drawings, and the actual site dimensions or conditions. Adjustments to accommodate these differences are typically made while laying out or marking the building. Thus, this time consuming method of: (a) dragging a set of blueprints around a construction site; (b) verifying that the building, as drawn, fits squarely onto the foundation as constructed: (c) when a foundation is not square, making field adjustments to properly place the building upon that foundation: (d) making field adjustments to accommodate for dimensional and other discrepancies between the drawings and the actual site conditions: and (e) actually transferring the information from the drawings to the building or site where the work will be performed. Ultimately, after this information has been correctly reconciled, it will have to be distributed to others associated with the project. These adjustments that are made to accommodate these field conditions may affect other trades involved with the project. These trades include but are not limited to those involved with the fabrication of components to be used within the building.

SUMMARY OF THE INVENTION

Starting from a set of plans, such as, without limitation, blueprints, drawings, or Autocad® files, a system and method is described herein for calibrating such plans and transferring such plans into a computer readable file and loading a specially designed electronic version of such plans into a hardware-based system that locates, adjusts, transfers, and prints, to a desired scale, a lasting image of said construction plans drawn onto a building surface, thus eliminating the need for workers to carry blueprints to a jobsite and physically transfer information from such blueprints onto the building site via the traditional method of snapping lines and marking of points.

DETAILED DESCRIPTION OF THE INVENTION

A system and method for, from a set of plans, such as, without limitation, blueprints, drawings, or Autocad® files, calibrating such plans and transferring such plans into a computer readable file and loading same into hardware that locates, adjusts, transfers, and prints, to a desired scale, a lasting image of that drawing onto the building surface, thus eliminating the need for workers to carry blueprints to a jobsite and physically transfer information from such blueprints onto the building site via the traditional method of snapping lines and marking of points.

Figure 1:
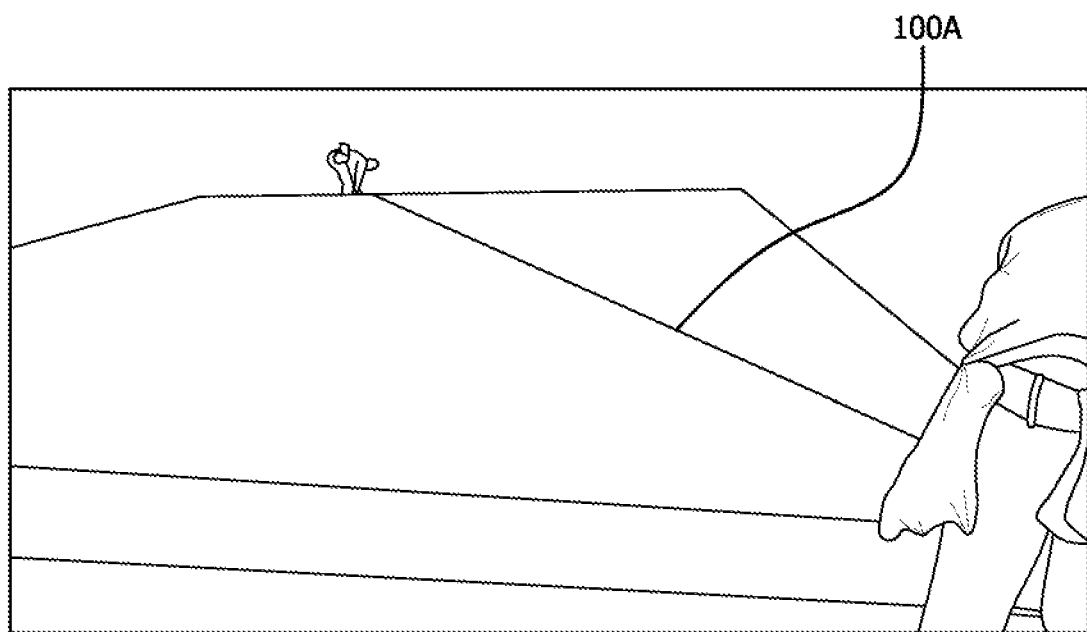
FIG. 1 and FIG. 2 illustrate the prior art method for layout techniques in construction of buildings.
Figure 2:
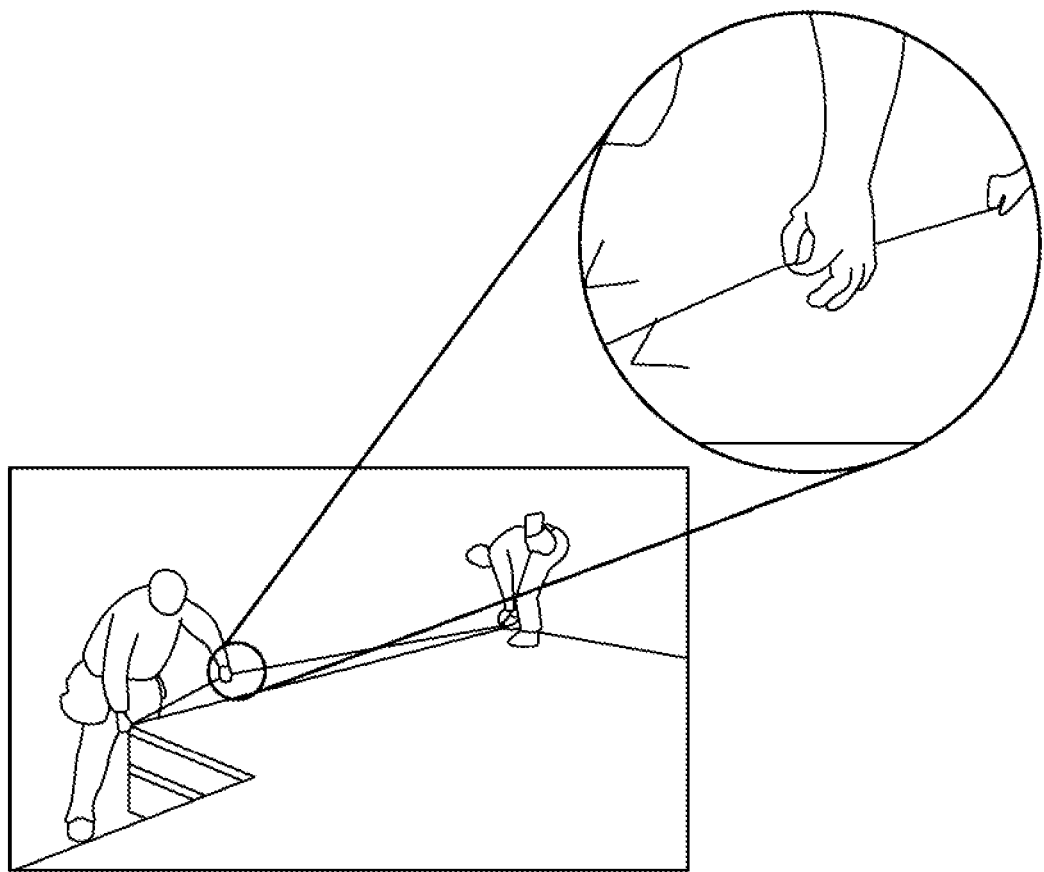
Figure 3:
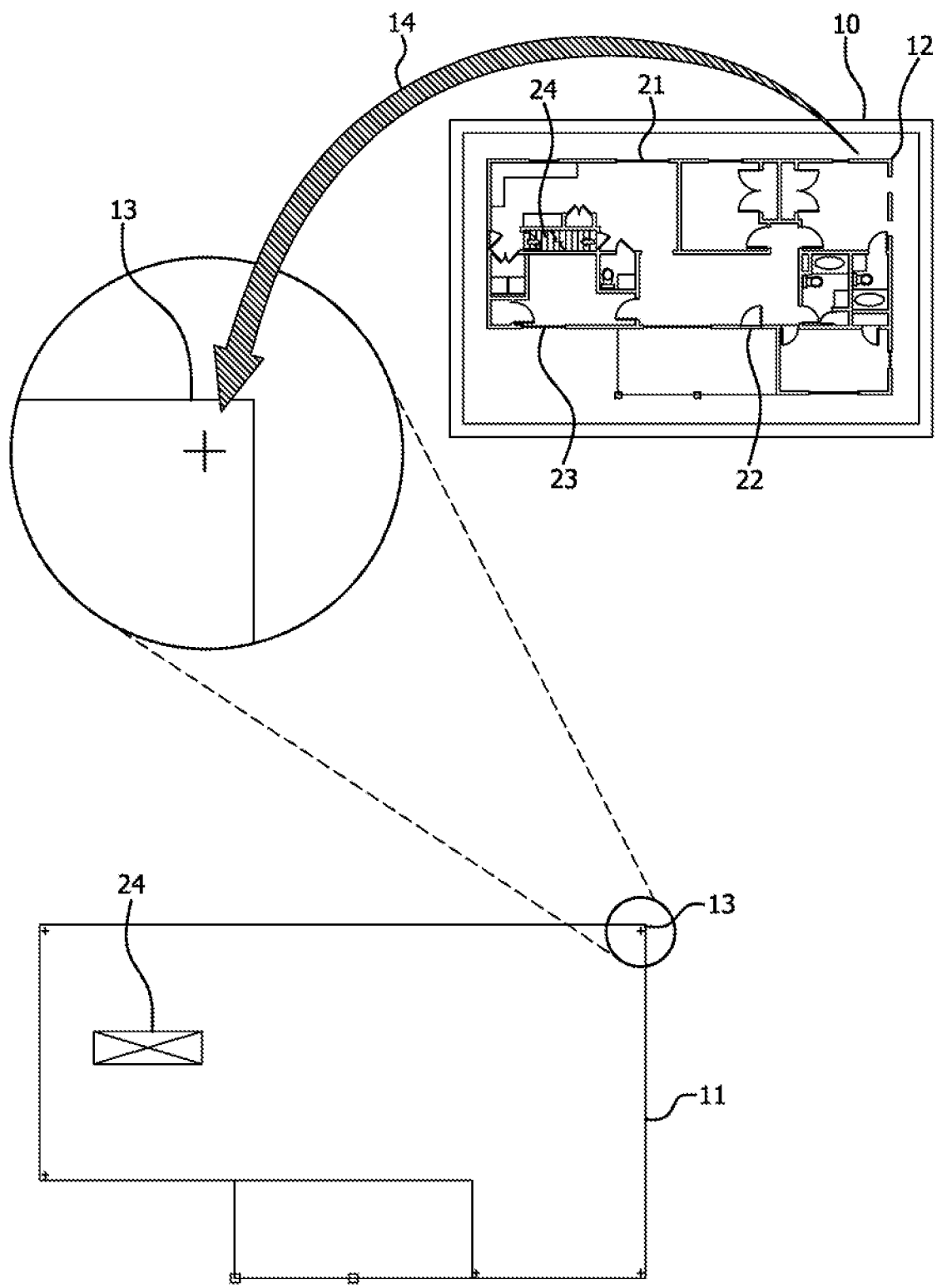
FIG. 3 depicts the transfer electronically of a construction location point on hardcopy of a blueprint to a relative position on a building construction surface.
Figure 5:
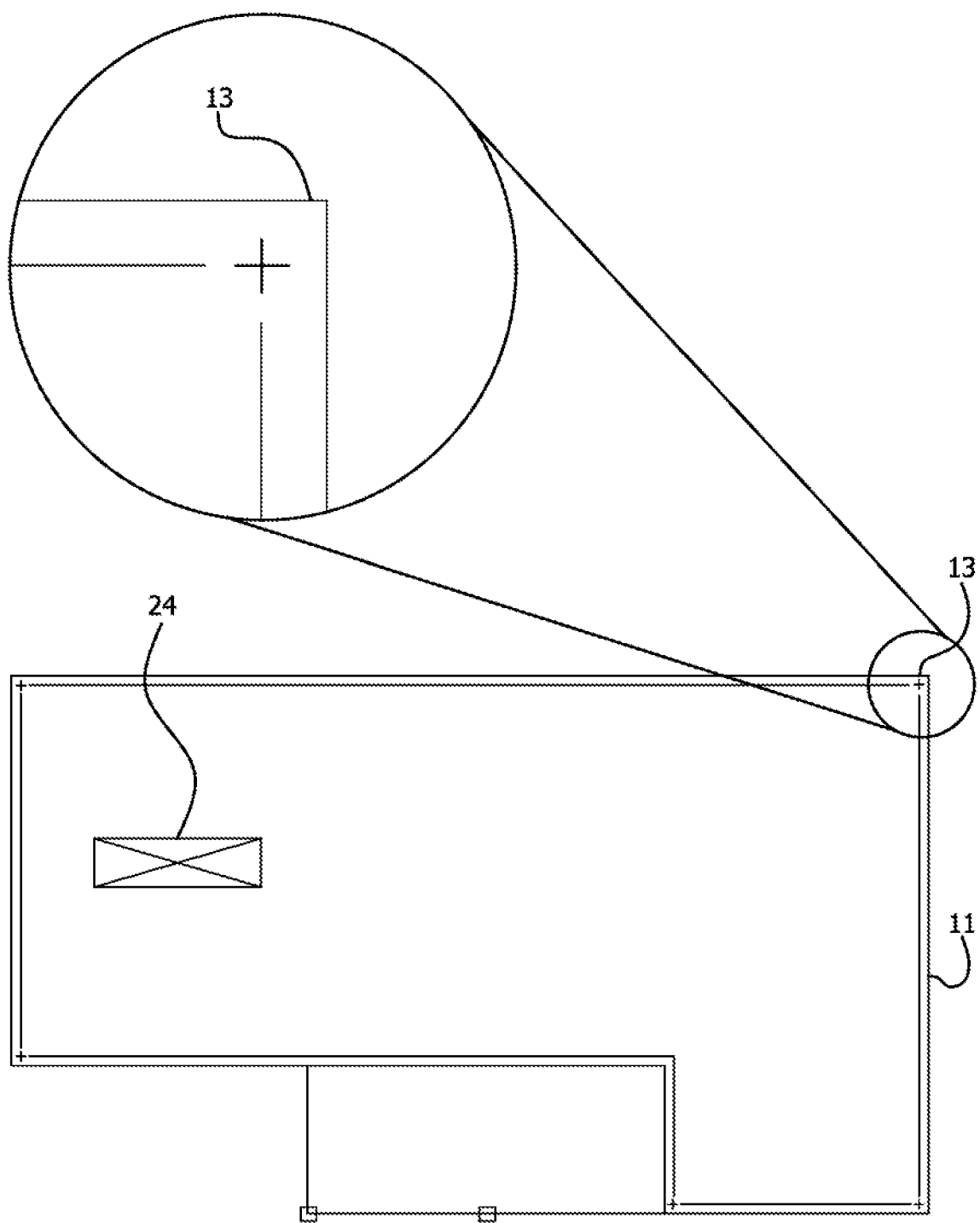
FIG. 5 is an exploded view of the corner of a building construction surface as marked by the system of the present invention.

The process is started by identifying and locating several reference points, for example, the corner reference point 13 as shown on FIG. 3, which shows hardcopy blueprint 10 (having floorplan 12 described on it) in juxtaposition with the building construction surface 11. In this case, the objective is to lay out for construction the proper locations for the walls 21, the door openings 22, the window locations 23, and the stairwells 24, all as shown on the hardcopy of the floorplan 12, onto the actual construction surface 11, whether that surface is a wood framed floor of a building or a concrete slab. In the prior art technology, as shown on FIGS. 1 and 2, points are marked on the building surface by persons who physically mark such points on several corners of the building construction surface by snapping lines such as line 100A in FIG. 1. As shown in FIG. 5, such points will correspond to the inside of the wall at the exact location where the two outside walls should intersect at that corner 13 on surface 11. This process is repeated at the other corners of the building.

Figure 4:
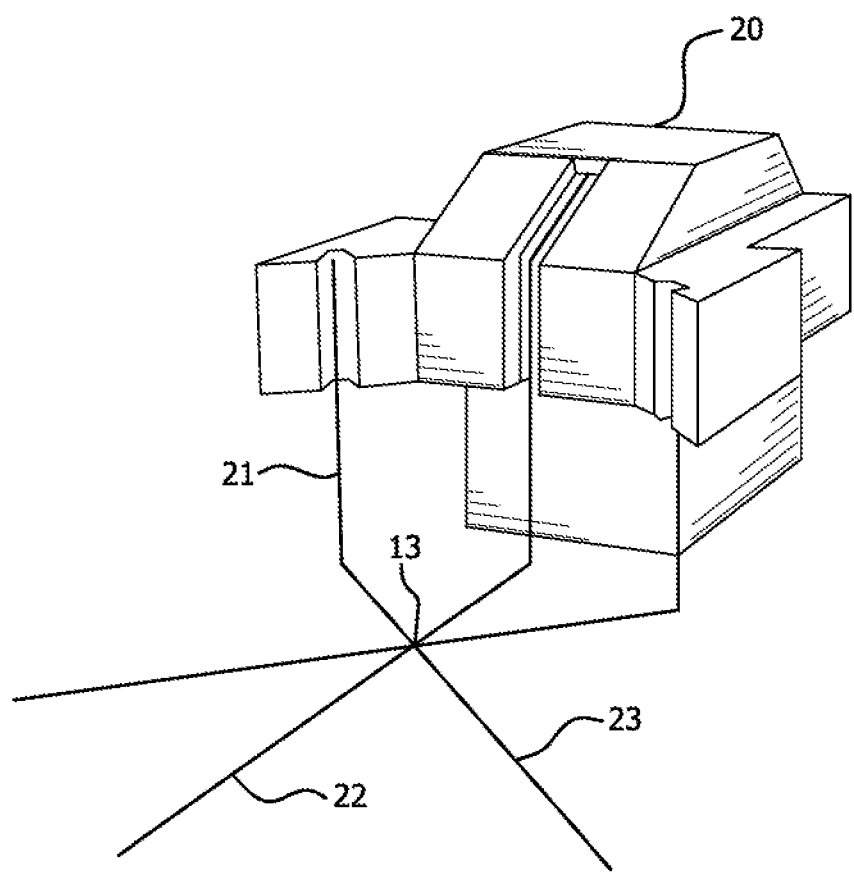
FIG. 4 is a perspective view of a laser device as placed at the corner of building construction surface.
Figure 10:
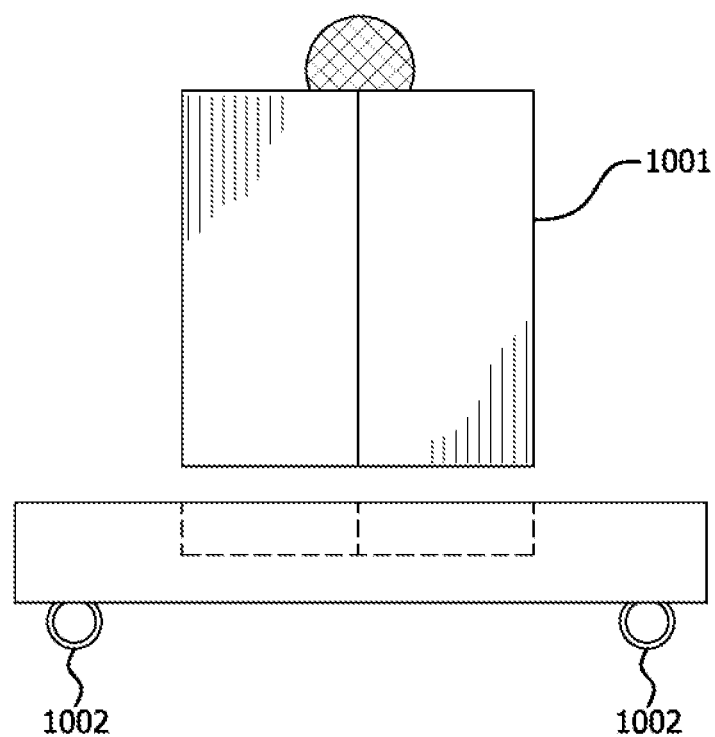
FIG. 10 is a perspective view of a robotic printer device.
Figure 11:
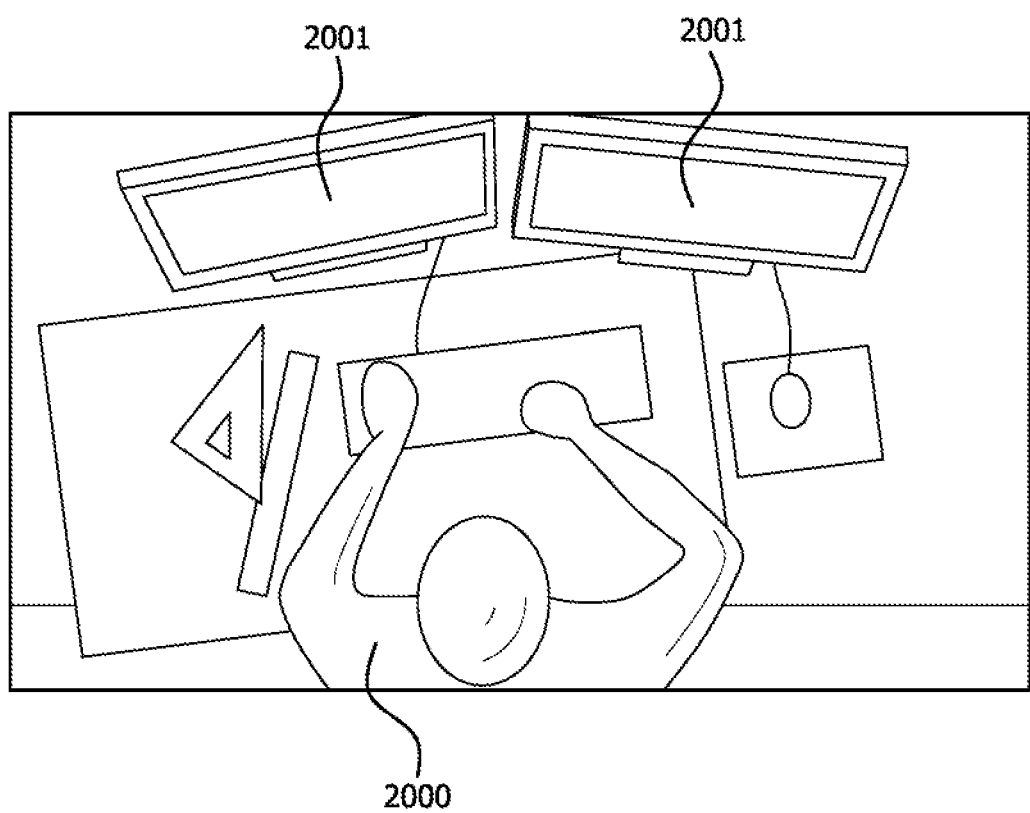
FIG. 11 shows the remote operation of the instant system by an operator.

As shown in FIG. 4, in the present invention a laser-based receiver/transmitter device 20 is place at said corner 13. Device 20 communicates with other similar laser devices and with the operator 2000 as shown in FIG. 11 of the system of the present invention. Using a panoply of generated laser references (in the preferred embodiment of this invention three such laser reference 21, 22, and 23) device 20 locates corner 13 on surface 11 as marked on floorplan 12 of the hardcopy blueprint 10. A panoply of said devices 20 communicate using software that identifies a device 20 closest to the referenced corner 13 and are self-adjusted to insure that the building to be constructed is square on surface 11, without the need manually to snap line, and to incorporate dimensional changes as the construction proceeds. These laser devices 20 communicate proper locations, such as corner 13, to a panoply of robotic printers, such as printer 1001, having wheels 1002 for movement to the proper position, as shown in FIG. 10.

Figure 6:
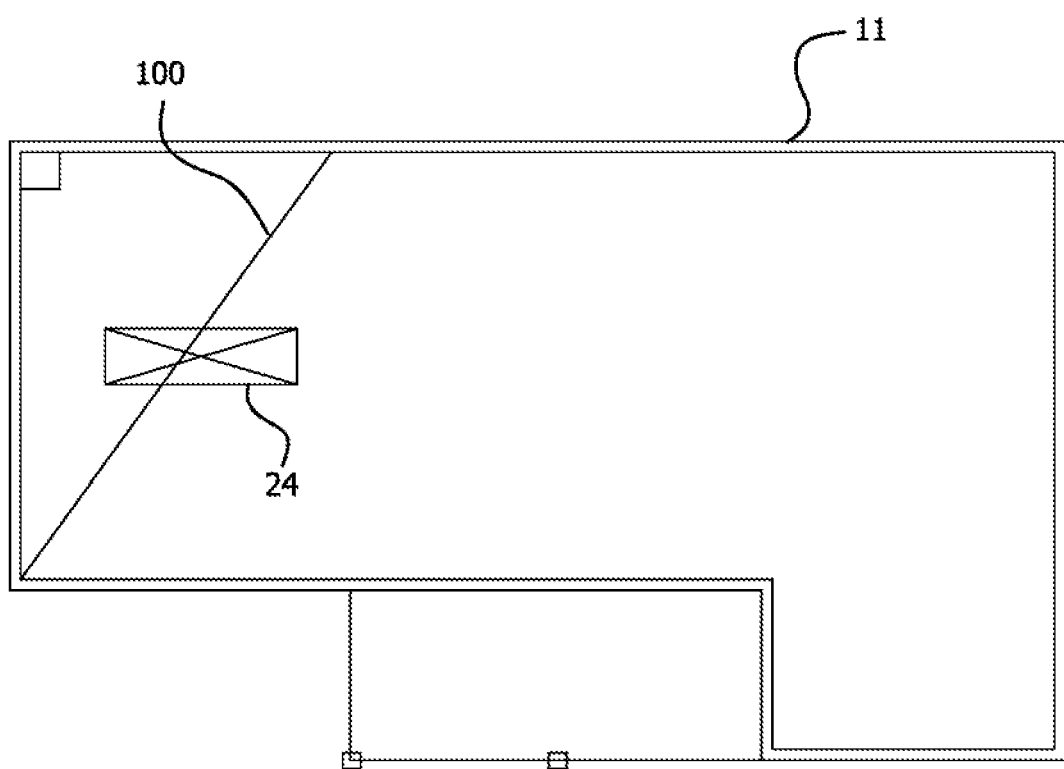
FIG. 6 is a view from above a building construction surface showing the placement for constructing a stairwell in said surface.

While said panoply of laser devices 20 are self-controlled by said software program, such control of said devices 20 is subject to being overridden remotely by the operator 2000 of the system at issue. Said operator 2000 as shown in FIG. 11 can communicate and control all of said devices remotely using a desktop computer having display screens 2001, or a laptop computer, from a construction office or by using a mobile device or tablet at the construction site. Using the process described above said operator checks to insure that said references created are square (that is, are at 90 degree angles to each other as shown in FIG. 6 by the use of electronically generated line 100 that electronically replicates the prior art physical line 100A as shown in use in FIG. 1). While said devices 20 by control of software self-adjust discrepancies and make adjustments until the reference lines are square to each other, further adjustments and fine tuning of reference points can be remotely changed by operator 2000. Upon obtaining the desired results, new final reference points along with new final reference lines projected by devices 20 are created which reference lines provide guides and boundaries for the robotic printers 1000 that print out the drawings onto the construction surface. The distance between the new final reference points is checked for accuracy and the results noted in the software of the system.

The method of use of the system described herein is as follows: Desired computer generated floor plans, drawings, or blueprints for the construction area in question are accessed. The points on the drawings that correspond with the new final reference points created above are identified and are matched with each other. The dimensions between the new final reference points are verified against the dimensions provided on the drawings. The drawings can be overlaid onto the new final reference lines.

Figure 7:
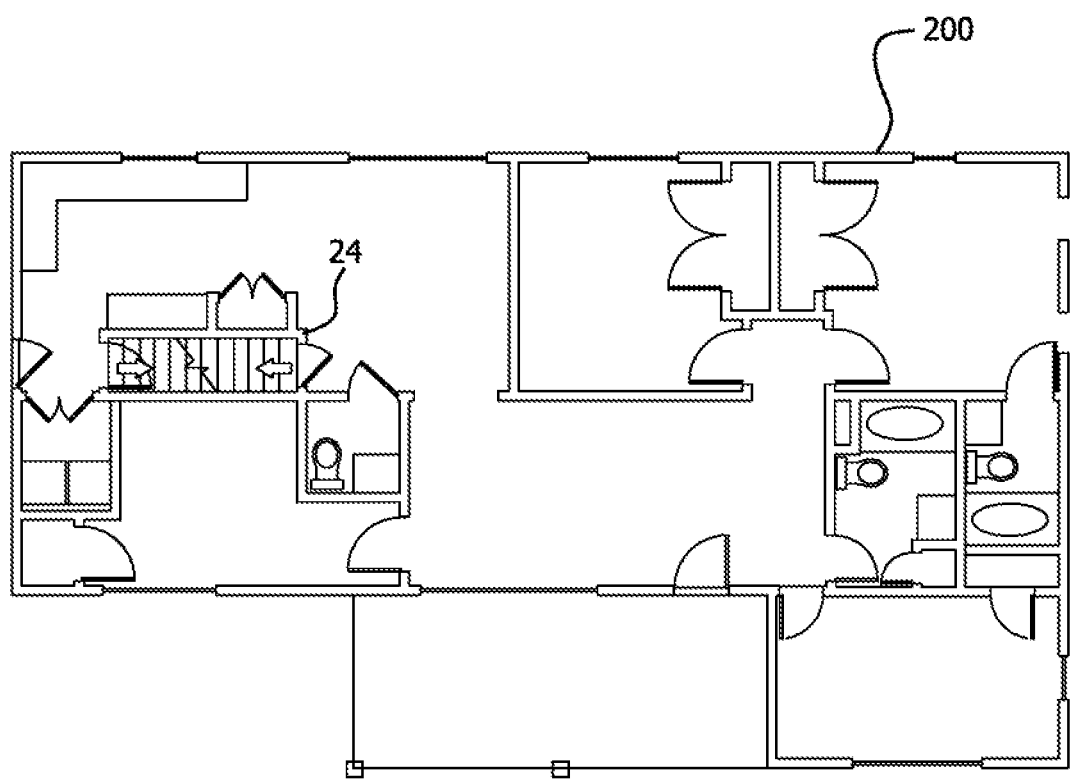
FIG. 7 is the final verified floorplan of the interior of a floor of a building to be constructed.
Figure 8:
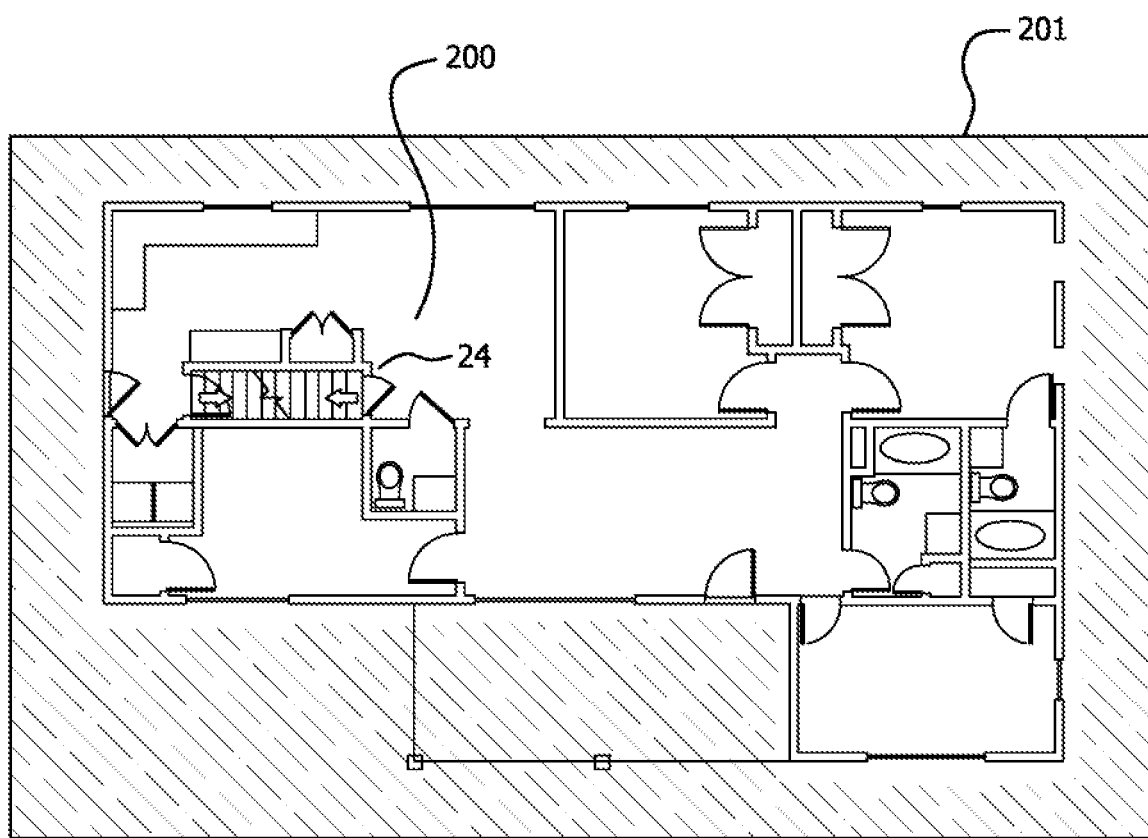
FIG. 8 is a juxtaposition of a floorplan as shown in FIG. 5 and the view from above of a building construction surface as shown in FIG. 4.

Adjustments can be made for any dimensional discrepancies between the dimensions supplied by the devices and the corresponding dimensions obtained from the drawings. These adjustments can be automatically made by the software or remotely by operator 2000, as shown in FIG. 11 using a desktop computer with display screens 2001, once the dimensions obtained from the drawings are entered and compared against the actual dimensions generated by the devices. These adjustments can be made by adjusting the new final reference points to correspond with the drawings, or the dimensions contained in the drawings can be adjusted to correspond with the dimensions obtained from the devices, or a combination of both. The end result will be a set of final files that are specific to that building and, which, in this case, can be used in laying out all of the walls, doors, and windows for each floor of this building as shown in FIG. 7.

Figure 9:
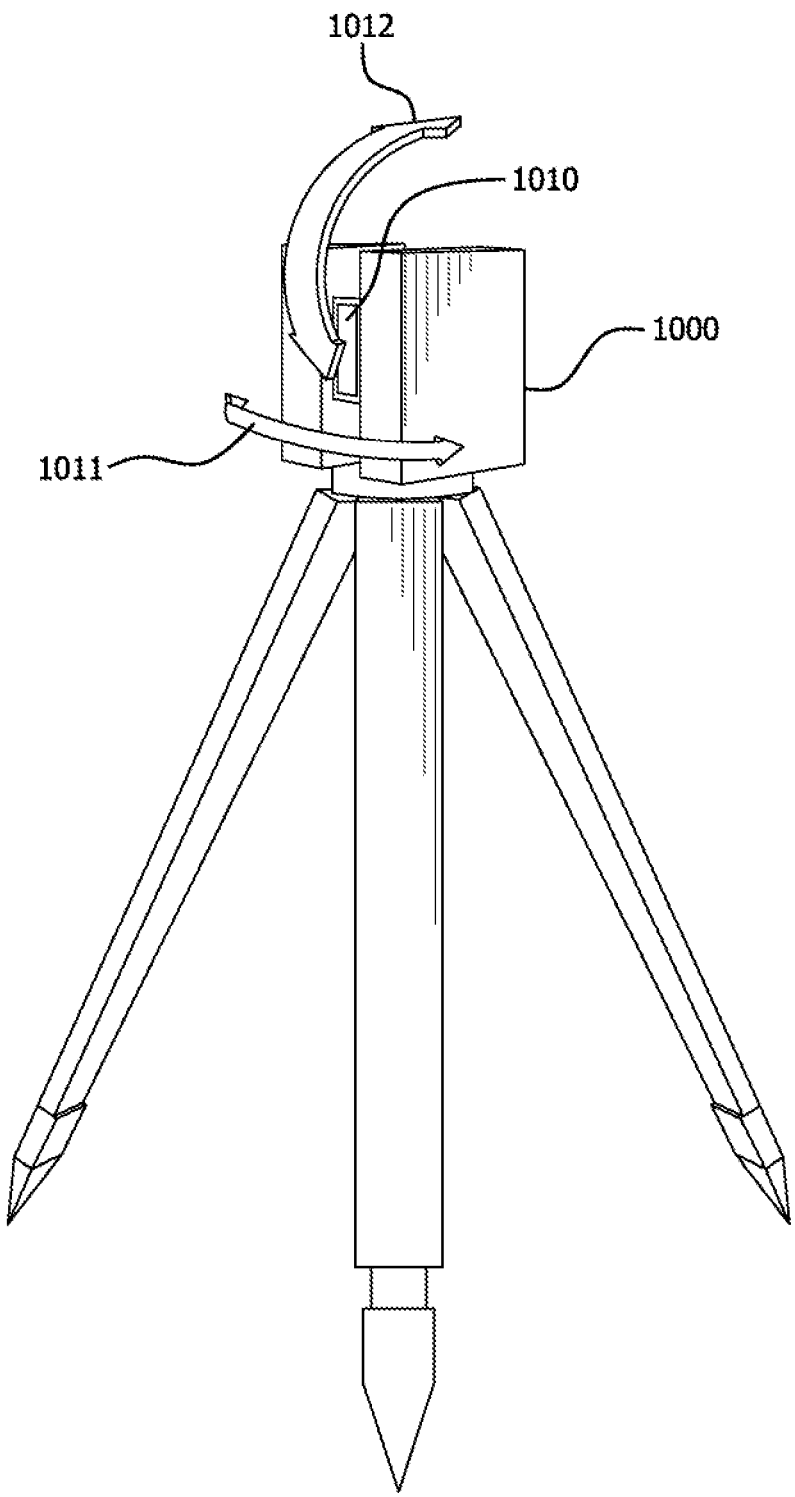
FIG. 9 is a perspective view of an auto-locator device.

At times there may be extraneous items or elements that may or may not be detailed in the drawings or that are created as a part of the construction process that may cause problems in laying out the construction site by the robotic printers 1000. Locating these items or elements is necessary for safety and to avoid delays in construction. As examples, such items may include plumbing fixtures, such as pipes, or bolts that are part of the construction process that protrude from the floor, temporary holes in a floor at which a stairwell is to be located, or protrusions of structural materials or scaffolding on the exterior of the building under construction. These items and elements can be identified and located on the building by the use of an auto locator device 1000 as shown in FIG. 9. An auto locator 1000 is programmed to work within the system in conjunction with laser devices 20 and robotic printers 1001, or may be used independently to locate elements, such as a pipe protruding through a floor under construction in order to insure that the location of such an element is identified as a hazard to be avoided by a moving robotic printer 1000. Auto locator 1000 is constructed so as to allow for full movement of its aperture 1010 in both the horizontal direction 1011 and in the vertical direction 1012, both relative to the construction surface 11 on which said auto locator is placed, and is programmed to communicate with all parts of the system under the control of the software of the system and remotely by operator 2000 in FIG. 11. Exact locations of the above referenced items and elements are identified and incorporated into the automated process described above. Dimensional adjustments, if needed to accommodate these items or elements, can be made in the same manner described above and incorporated into the final drawings as shown in FIG. 7. Auto locator 1000, which can be free standing as shown in FIG. 9 or incorporated on top of a laser device 20, marks points and transfers them directly to the electronic drawings, which points are matched to a library of shapes for identification in said drawings, such as "a pipe protruding from floor." The size of the protruding pipe is entered into the drawings so that a robotic printer 1001 in its motion will avoid contact with the protruding pipe.

FIG. 10 is a robotic printer 1001 known in the art. A panoply of such printers 1001 in the preferred embodiment are placed on the construction surface 11 in order that the final drawings are automatically printed onto construction surface 11. Operator 2000 transmits information as described above and contained in the final drawings as directions to the robotic printers 1001. Robotic printers 1001 efficiently transfer all the desired information from the drawings onto the surface 11 for proper construction of a floor or a building. Robotic printers 1001 automatically divide the printing tasks, or operator 2000 may override the software program to assign certain printing tasks between or among a panoply of robots 1001. Having identified all hazardous items and elements, robotic printers 1001 automatically avoid or work around certain areas during construction. As a result, robotic printer 1001 is prevented from falling off the side of a building under construction, or falling down an open stairwell, or running into a protruding pipe. Robotic printers 1001 communicate wirelessly under control of the system software with laser devices 20, auto locators 1000, or with both to retrieve and share information, and as such are used to layout simple or intricate designs to be incorporated into final floor as constructed. Information from the drawings can be used by a fabricator in the cutting of the individual pieces of material to be used on a floor printed using the system and in accordance with the method described herein. Such pieces can be numbered, or marked to match the same markings placed on the floor by the robot 1001 and similar work can be done when creating a design on a ceiling or walls. A layout or design can either be drawn out on the floor and transferred directly to the ceiling or walls, or applied directly to the ceiling or wall. "No Go Zones" can be identified on surfaces as described in the electronic drawings using auto locator 1000 or laser devices 20, or may be remotely entered into the electronic drawings by operator 2000. A "No Go Zone" at a stairwell is set by an auto locater 1001 identifying the perimeters of the stairwell. Once a "No Go Zone" is established electronically, robotic printer 1001 is prohibited from entry by automatic software command.

The system is programmed to mark and to create lines and designs of different shapes and colors onto a construction surface 11 and the scale of the drawings or pictures being transferred can be adjusted remotely by operator 2000. These markings can be done so as to be resistant to a variety of weather conditions and foot traffic. Various structures can be color coded (i.e., walls-black lines, window openings—green, cabinet locations—red, electrical fixtures—purple, or plumbing fixtures—blue).

A history comprised of computer generated files detailing the initial runs of the panoply of robot printers 1001 for a variety different sized projects is stored in a centralized program in the present invention for use in estimating duration and complexity for future projects. As more and more projects are completed, this predictive database will grow, thus increasing its usefulness for future estimates of time and cost to complete a host of different construction projects.

The system is programmed to alert operator 2000 as to the estimated time to complete tasks. Upon completion of tasks by robotic printer 1001, the software of the system alerts operator 2000 or others in the construction staff, such as the general contractor owner of the property, via text, email, or automated phone call.

While one robotic printer 1001 can be used to complete this work, the option of using multiple robots 1001 can be taken in order to complete the entire layout expeditiously.

As noted above, all information obtained during layout using the present invention for each specific building or project is stored for potential future use in estimating and completing future projects.

This system can be programmed to mark lines and add shapes on foundations, floors, and walls using lasers that can create permanent lines, markings, or drawings onto surfaces. Using the system described with drones and GPS signals allows the construction company to layout, mark, and add shapes on concrete, wood, or other surfaces. Such drawings can be covered with a veneer or poly coating to preserve the drawing and make permanent on a concrete floor so marked.

The invention described herein is not limited to the preferred embodiment. The process described can be in many industrial settings, including, but not limited to: layout of excavation work or other site work; layout of foundations; layout for framing; layout for HAVC, plumbing, or electrical systems; layout for interior finishes; layout for painting; and for creating designs and murals, or parking lot or street line stripes painting.

What is claimed is:

1. A system for printing out a lasting image of construction plans on a building surface at a construction site comprising:
    a computing device having wireless connectivity and running an application program, wherein a copy of a set of said construction plans containing reference points for construction corners are calibrated and converted into an electronic version of a computer readable file in said computing device;
    at least one laser-based receiver/transmitter wirelessly connected to said computing device and under control of said application program, wherein said at least one laser-based receiver/transmitter to identify and locate said reference points on said building surface;
    at least one auto locator wirelessly connected to said computing device and under the control of said application program, said at least one auto locator is on free standing or incorporated on top of said at least one laser-based receiver/transmitter; and
    at least one mobile robotic printer wirelessly connected to said computing device and under control of said application program, said at least mobile robotic printer is positioned and in movement in said construction site;
    wherein said at least one auto locator is capable to work independently or work within said system in conjunction with said at least one laser-based receiver/transmitter and said at least one mobile robotic printer, said at least one auto locator is constructed for full movement in horizontal and vertical directions relative to said construction surface, and said at least one auto locator locates hazardous elements for said at least one mobile robotic printer while in moving around certain areas in said construction site during construction; and
    wherein said at least one laser-based receiver/transmitter locates at least one corner reference on said building surface and said at least one mobile robotic printer prints out said lasting image of said construction plans on said building surface at said construction site.

2. The system of claim 1
    wherein said at least one laser-based receiver/transmitter locates at least one corner reference on said building surface, and said at least one auto locator locates elements identified as hazards for avoidance while said at least one mobile robotic printers moving in said construction site, and said at least one mobile robotic printer prints out said lasting image of said construction plans on said building surface at said construction site.

3. The system of claim 2 in which said hazards are selected from the group consisting of: pipes protruding from said building surface; temporary holes in said building surface; bolts protruding from said building surface; protrusions of structural materials; protrusions of scaffolding; and stairwells.

* * * * *